(12) United States Patent
Crema et al.

(10) Patent No.: US 10,408,952 B2
(45) Date of Patent: Sep. 10, 2019

(54) RADIATION SCINTILLATOR DETECTOR, DETECTOR PACKAGE AND MANUFACTURING PROCESS THEREOF

(71) Applicant: STMICROELECTRONICS S.R.L., Agrate Brianza (IT)

(72) Inventors: Paolo Crema, Vimercate (IT); Alessandro Freguglia, Milan (IT); Piero Fallica, Catania (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 15/939,096

(22) Filed: Mar. 28, 2018

(65) Prior Publication Data
US 2018/0284299 A1  Oct. 4, 2018

(30) Foreign Application Priority Data
Mar. 29, 2017 (IT) ................. 10201734664

(51) Int. Cl.
| | | |
|---|---|---|
| G01T 1/208 | (2006.01) | |
| H01L 31/0203 | (2014.01) | |
| G01T 1/202 | (2006.01) | |
| G01T 1/20 | (2006.01) | |
| G01T 7/00 | (2006.01) | |

(52) U.S. Cl.
CPC .............. *G01T 1/208* (2013.01); *G01T 1/202* (2013.01); *G01T 1/2002* (2013.01); *G01T 1/2018* (2013.01); *G01T 7/00* (2013.01); *H01L 31/0203* (2013.01)

(58) Field of Classification Search
CPC ..... G01T 1/2018; G01T 1/208; G01T 1/2002; G01T 1/00; H01L 31/0203
See application file for complete search history.

(56) References Cited

U.S. PATENT DOCUMENTS

| | | |
|---|---|---|
| 5,179,284 A | 1/1993 | Kingsley et al. |
| 10,024,985 B1 | 7/2018 | Newman |
| 2010/0090115 A1 | 4/2010 | Lerch et al. |
| 2010/0314531 A1 | 12/2010 | Menge |

(Continued)

FOREIGN PATENT DOCUMENTS

WO   2008/107808 A2   9/2008

OTHER PUBLICATIONS

Greco, "Characterization of Silicon Photomultipliers Devices for Applications of Radiation Monitoring," thesis, University of Catania, Catania, Italy, 2008-2009, 137 pages (machine generated English translation).

(Continued)

*Primary Examiner* — David P Porta
*Assistant Examiner* — Fani Boosalis
(74) *Attorney, Agent, or Firm* — Seed IP Law Group LLP

(57) ABSTRACT

A radiation scintillator detector comprising a substrate on which are arranged a scintillator module and a silicon photomultiplier optically coupled one to the other. The detector includes a package comprising an outer casing enclosing said scintillator module and said photomultiplier, said package comprising inside said outer casing an inner casing comprising resin reflecting photons, in particular infrared and/or visible photons, emitted by said scintillator module upon receiving a ionizing radiation, enclosing said scintillator module and said photomultiplier.

19 Claims, 2 Drawing Sheets

(56) References Cited

U.S. PATENT DOCUMENTS

2011/0017911 A1* 1/2011 Flamanc ............... C09K 11/02
250/361 R
2017/0363768 A1* 12/2017 Berheide ............... G01V 5/101

OTHER PUBLICATIONS

Greco, "Caratterizzazione di Dispositivi Fotomoltiplicatori al Silicio per Applicazioni di Monitoraggio di Radiazioni," thesis, Universita' Degli Studi di Catania, Catania, Italy, 2008-2009, 131 pages.
Hamamatsu Photonics K.K., "Radiation detection modules, C12137 series," Cat. No. KACC1196E05, Feb. 2016. (9 pages).

* cited by examiner

RADIATION SCINTILLATOR DETECTOR, DETECTOR PACKAGE AND MANUFACTURING PROCESS THEREOF

BACKGROUND

Technical Field

Embodiments of the present disclosure relate to solutions concerning a scintillator detector comprising a substrate on which are arranged a scintillator module and a silicon photomultiplier optically coupled one to the other.

Description of the Related Art

Presently, the main instruments which measure radioactivity are the well-known Geiger detectors, which however, use as a probe a cylinder which contains gas at very a low pressure and a filament held at high electro potential, for instance 100V, and cannot be miniaturized.

Radiation detectors frequently employed for ionizing radiation such as gamma-ray or x-ray detectors are scintillator detectors, which use a scintillator material which converts energy deposited by a given type of radiation (e.g., rays composed by alpha, beta or gamma particles or beta-rays, or x-rays) into light. The light is directed to a photodetector, which converts the light generated by the scintillator into an electrical signal, which may be used to measure the amount of radiation which is deposited in the crystal. This type of detector arrangement can be more easily miniaturized in order to fit in portable devices.

BRIEF SUMMARY

A particularly effective solution is represented by a scintillator detector in which a scintillator module and a silicon photomultiplier are optically coupled one to the other. They are arranged on a PCB (Printed Circuit Board). This solution presents a limited degree of miniaturization, consuming a fair portion of area on the PCB substrate, and present further drawbacks in term of power consumption and costs.

In view of the above, it is an objective of the present disclosure to provide solutions which overcome one or more of the above drawbacks.

According to one or more embodiments, the present disclosure is directed to a radiation scintillator detector having the features specifically set forth in the claims that follow. Embodiments moreover concern a related detector package and a related manufacturing process.

The claims are an integral part of the technical teaching of the disclosure provided herein.

As mentioned before, the present disclosure relates to a radiation scintillator detector comprising a substrate on which are arranged a scintillator module and a silicon photomultiplier (such as a photomultiplier chip or die) optically coupled one to the other, that includes a package comprising an outer casing enclosing said scintillator module and said photomultiplier, said package comprising inside said outer casing an inner casing comprising resin reflecting photons, in particular infrared and/or visible photons, emitted by said scintillator module upon receiving a ionizing radiation, enclosing said scintillator module and said photomultiplier.

In various embodiments, the detector includes that said inner casing is obtained by filling the space between said outer casing and said scintillator module and said photomultiplier being filled with a resin reflecting photons, in particular infrared and/or visible photons, emitted by said scintillator module upon receiving a radiation.

In various embodiments, said resin is a white pigmented resin, in particular a resin comprising titanium dioxide.

In various embodiments, said external casing comprises a black pigmented resin, in particular an epoxy resin comprising carbon black.

In various embodiments, said external casing is supported by said substrate and the side of said external casing facing said substrate is open.

In various embodiments, said silicon photomultiplier is arranged on a surface of the substrate and the scintillator module is arranged on the silicon photomultiplier.

In various embodiments, said detector is included in a portable device, in particular a smartphone.

The present disclosure relates also to a process for manufacturing a scintillator detector package as described above, that includes attaching a silicon photomultiplier to a face of a substrate, attaching the scintillator module on a face of the silicon photomultiplier not attached to the substrate, wire bonding the silicon photomultiplier to the substrate, encasing the scintillator module and the silicon photomultiplier in said resin reflecting photons in particular infrared and/or visible photons, emitted by said scintillator module upon receiving a radiation, encasing said photons reflecting resin in an external protective resin casing.

In various embodiments, the process includes that, after said encasing in an external protective resin casing a singulation step is performed.

In various embodiments, the process includes that said encasing the scintillator module and the silicon photomultiplier in said resin reflecting photons includes dispensing said resin or molding said resin.

In various embodiments, the process includes that encasing said resin reflecting photons in an external protective resin casing, includes molding said external protective resin casing.

The present disclosure relates also to a package for a detector as described above, which comprises an outer casing to enclose said scintillator module and said photomultiplier, said package comprising inside said outer casing an inner casing comprising resin reflecting photons, in particular infrared and/or visible photons, emitted by said scintillator module upon receiving a radiation, enclosing said scintillator module and said photomultiplier.

BRIEF DESCRIPTION OF THE SEVERAL VIEWS OF THE DRAWINGS

Embodiments of the present disclosure will now be described with reference to the annexed drawings, which are provided purely by way of non-limiting example and in which.

DETAILED DESCRIPTION

In the following description, numerous specific details are given to provide a thorough understanding of embodiments. The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

As mentioned, the solution here described refers to radiation scintillator detector having a package structure which can be used with standard packaging components, this making it possible to miniaturize the detector implementing standard assembly technology.

The radiation detector includes a scintillator module, i.e., scintillation probe, comprising a scintillator crystal coupled to a silicon photomultiplier. The scintillator module converts gamma radiation into visible or infrared light, which gets collected by the silicon photomultiplier, which in turn converts the light signal into an electronic signal. This type of device is capable of conveying two types of information: the radioactive event or count and the energy of the incident radiation.

Figure 1:
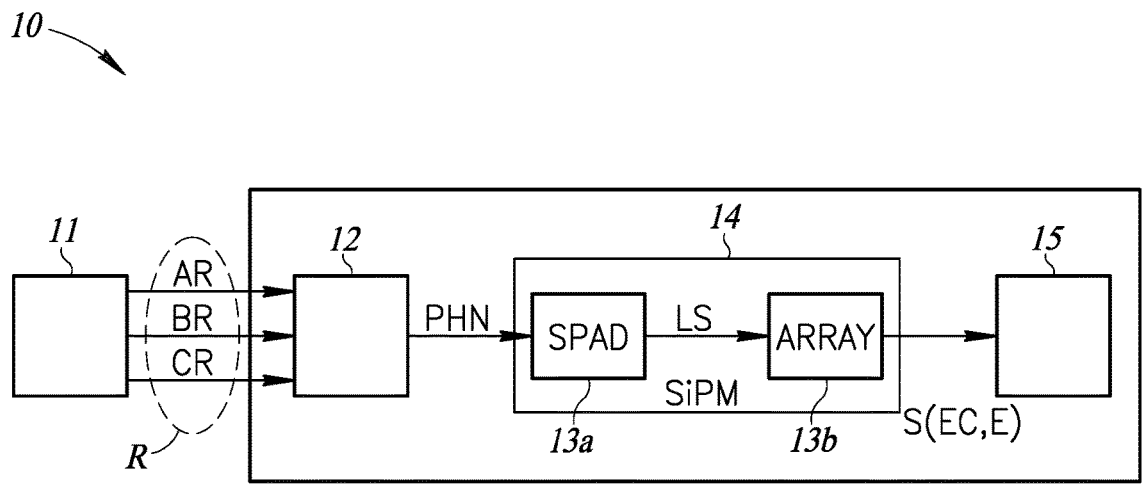
FIG. 1 shows schematically functional modules of a radiation detector of the type here described.

In FIG. 1 it is schematically represented a scintillator detector, indicated with the numeric reference 10. The detector includes a plurality of modules that have a variety of functions. A source 11 of ionizing radiation R, which can be represented by one or more among alpha particles AR, beta particles BR and gamma particles CR is shown. The source 11 can be any radioactive material or radiation generator. Such radiation R is received by a scintillator crystal module 12, containing material that exhibits scintillation, i.e., the property of luminescence when excited by ionizing radiation. For instance the material is CsI(Tl), thallium activated cesium iodide. Therefore the scintillator crystal module 12 emits infrared and visible photons PHN when it receives the ionizing radiation R. Such photons PHN are received by a Silicon PhotoMultiplier (SiPM) module 14. The Silicon PhotoMultiplier 14 is known per se to the person skilled in the art. At any rate with 13a is depicted a Single Photon Avalanche Diodes (SPAD) operating in Geiger regime and attached to an avalanche quenching resistance, which generates as output a current pulse LS, when a photon PHN hits a specific SPAD. With 13b is depicted an arrangement in a bidimensional planar array of such Single Photon Avalanche Diodes (SPAD) 13a operating in Geiger regime configured so that the output signal S is the analogic sum of the current pulses of the SPADs 13a in the array 13b. This means that the output signal S is an analog signal, which is proportional to the energy E of the incident gamma photons or beta particles.

The output signal S which is an electric signal, can be handled by a processor 15 that is with a portable electronic device, such as a mobile phone or smartphone, in which the detector 10 is mounted. The processor 15 may be on a separate printed circuit board or different package from the detector. The processor receives the output signal from the detector to be processed by software configured to display the radiation detection information to a user of the portable device.

Figure 2:
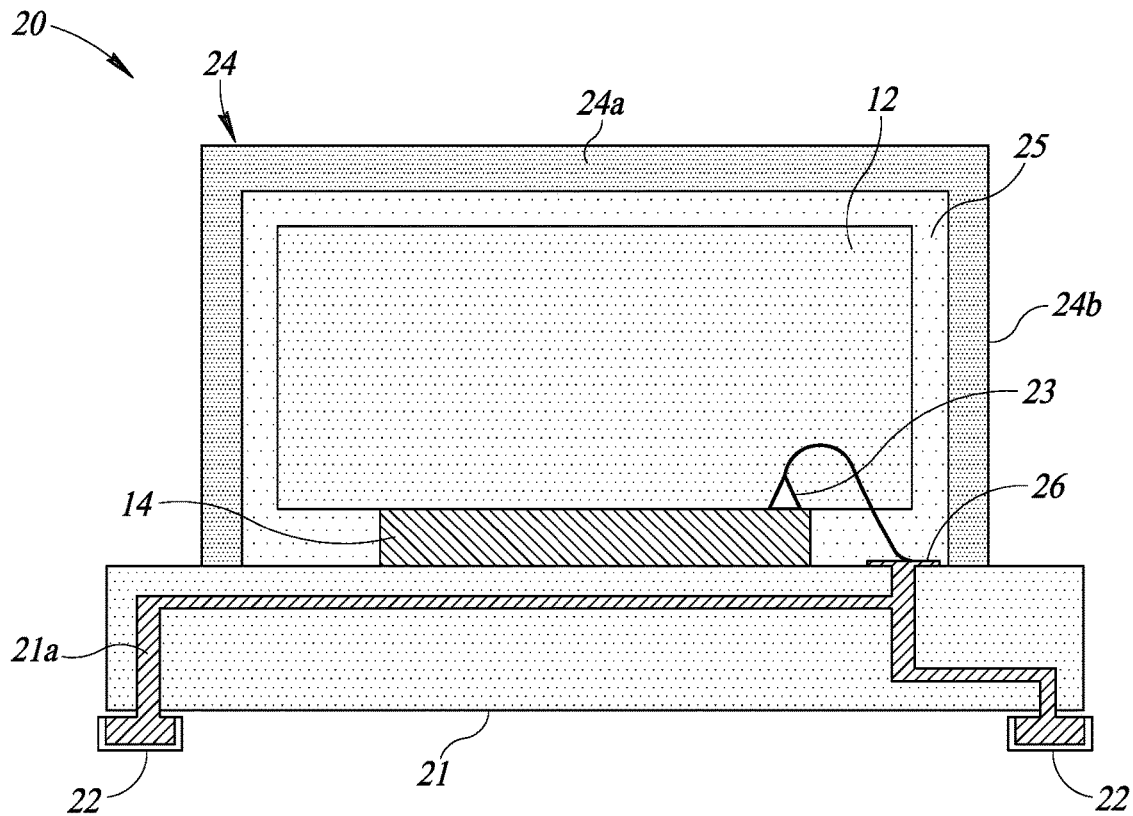
FIG. 2 shows schematically the structure of a radiation detector of the type here described.

In FIG. 2 it is shown schematically a scintillator detector 20 having a package structure that enables to miniaturize the detector implementing standard assembly technology.

In particular, this is obtained by encasing the ensemble of the scintillation module 12 and silicon photomultiplier 14. This is obtained by coupling a white, reflective inner resin, which reflects back visible and near-IR photons PHN generated by the scintillator crystal 12 back to the silicon photomultiplier 14 to an outer standard black resin, which encases and protect the whole detector, using a standard assembly technology.

Accordingly, in FIG. 2 it is shown a substrate 21 which is for instance represented by a glass-reinforced epoxy laminate sheet, such as the one used for PCBs (Printed Circuit Boards) of FR4 grade, preferably a double layer FR3 laminate. In the following it will made reference to a horizontal direction which is parallel to the plane of the substrate 21, while vertical directions are perpendicular to such horizontal plane. Of course, given the substrate 21 can be positioned in any position in space according to the use and mounting of the sensor, in particular the substrate 21 is meant to be associated electrically to another PCB or electrical connection board, for instance inside the device 15, through contacting pads 22. To this end, the substrate 21, which in FIG. 2 lies in horizontal position, includes two of such contacting pads 22 on its lower surface. A metal via 21a runs within the substrate 21 and connects the two contacting pads 22 with an upper contacting pad 26 placed on the upper surface of the substrate 21. On an upper face of the substrate 21 is attached, for instance by gluing or soldering, the silicon photomultiplier 14. As mentioned the silicon photomultiplier 14 is represented by a dimensional planar array presenting a lower face attached to the upper face of the substrate 21 and an upper face on which is attached by gluing the crystal scintillator 12. A wire bonding 23 connects the upper surface of the substrate 21 to the upper face of the silicon photomultiplier 14.

As it can be seen in FIG. 2, the silicon photomultiplier 14 and the scintillator module 12 are encased inside an outer casing 24, which is a parallelepiped box shaped black resin casing, which is supported by the substrate 21. Such black resin casing 24 includes a roof wall 24a and lateral walls 24b, which are supported by said substrate, but the floor wall is absent, i.e., the side of said outer casing 24 facing said substrate 21 is open, so that it is supported directly by the lateral walls 24b laying on the substrate 21. The inner space between the walls 24b and roof 24a of the inner casing 24 and the scintillation module 12 and silicon photomultiplier 14 is not empty, but it is filled with a white resin, forming an inner casing 25. Preferably the resin of the inner casing 25 fills completely all the space available within the outer casing 21 from the substrate 21 to the roof 24a, which is not occupied by the scintillation module 12 and silicon photomultiplier 14. However, in variant embodiments, the inner casing 24 can be a capsule or a glob or a molded shape encapsulating the scintillation module 12 and silicon photomultiplier 14, but leaving some space inside the outer casing 21 not filled.

The black resin of the outer casing 24 is preferably a standard resin used for the integrated circuits packages, since preferably the outer casing 24 is a standard casing for standard LGA (Linear Grid Array). The black resin can be epoxy containing a carbon black pigment.

The white resin used for the inner casing 2 is a resin such that reflects the photons PHN, which can be in particular infrared and/or visible photons, emitted by the scintillator module 12 upon receiving a radiation R. For instance, such resin is a white pigmented resin, in particular a resin comprising titanium dioxide, although other materials can be used as the white resin. The white resin must have the highest possible reflectivity, preferably above 90%, preferably near 100%, in the region of the peak of the emission of the scintillator 12 crystal. For instance, in the embodiment described the CsI(TI) crystal has a emission peak at a wavelength of 550 nm and a lower wavelength cutoff of 320 nm. The titanium dioxide is above 90% of reflectance from just above 400 nm in case of the rutile form and even before in the case of atanase, therefore it is well above 90% in the region of the peak (for instance reference can be made to the Full Width at Half Maximum). It is however clear that the person skilled in the art is able to find, given a scintillator crystal such as CsI(TI), or CsI(Na) or the other crystal, not necessarily chosen among the alkali halide crystals or the inorganic crystals, a resin having a reflectance over 90% in the peak region By way of example, the crystal of the scintillator module 12 of FIG. 2 is 7 mm wide in the horizontal direction and 3 mm of height. The thickness of the walls 24b and 24a is 0.2 mm, as it is the thickness of corresponding walls of the inner casing 25, i.e., the filled space between module 12 and vertical walls 24b. Therefore the total width of the outer casing 24 is 7.8 mm. The silicon multiplier is 5.1 mm wide and 0.7 mm of height. The substrate 11 is 1.7 mm of height or thickness, determining a total height of the scintillator detector 20 of circa 5.8 mm. This shows that devices with dimension like 6×6 or 5×5×5 mm$^3$ compatible with LGA standard packaging are easily obtained with the detector here described and the corresponding manufacturing process.

The crystal 12 can be wider than a width of the photomultiplier, for example, see cross-sectional view in FIG. 2. The substrate is wider than both the crystal and the photomultiplier. A portion of the surface of the substrate remains exposed by the photomultiplier and is overlapped by the crystal. This portion of the substrate is covered by the inner casing. There is a space or gap between the crystal and the substrate that is filled with the inner casing. The space or gap may encircle the entire photomultiplier or may be only along a couple portions of the photomultiplier.

Figure 3:
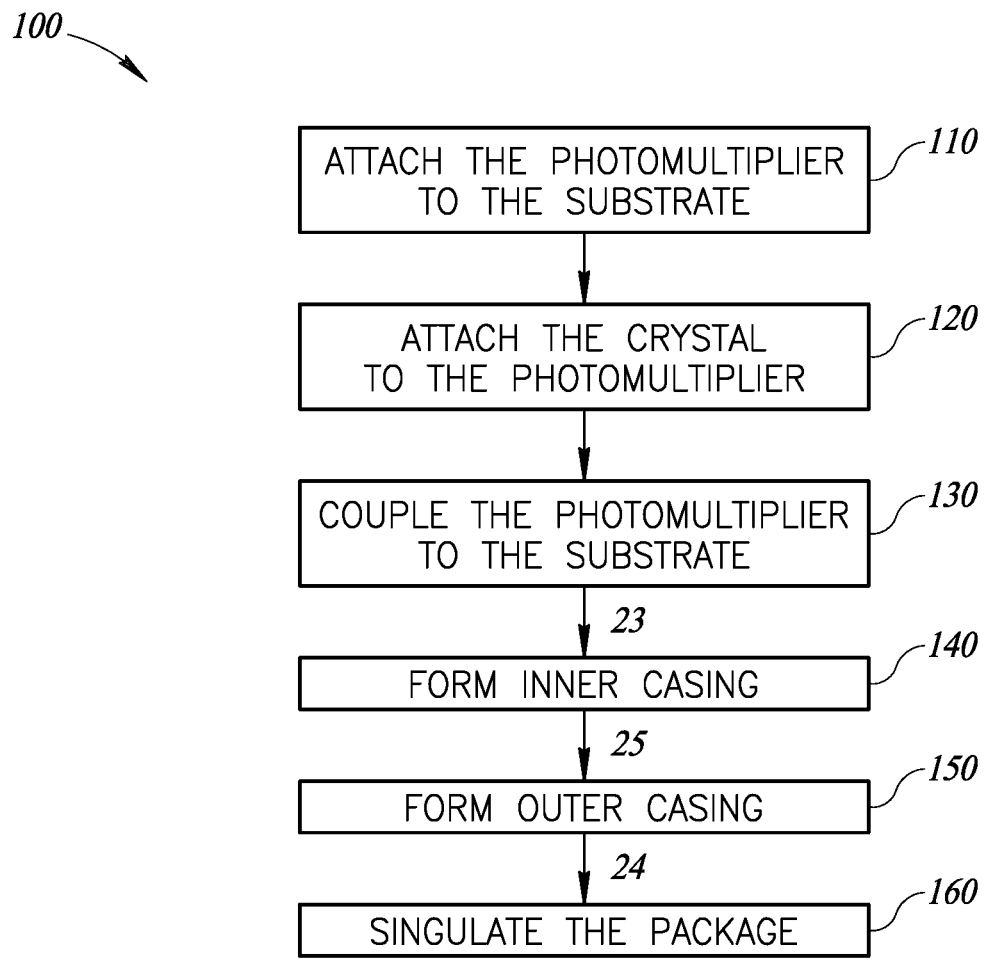
FIG. 3 shows a flow diagram of steps of a manufacturing process of the radiation detector of FIG. 2.

In FIG. 3 it is shown a flow diagram schematizing a process flow to manufacture the detector 20, indicated as a whole with the reference 100.

The process includes, in a first step 110, attaching the silicon photomultiplier 14 to the laminates of the substrate 21. This can happen by gluing, soldering, bumping or by any other standard technique used in IC packaging.

Then, in a step 120 the crystal of the scintillator module 12 is attached, for instance by gluing, onto the upper face of the silicon photomultiplier 14.

Then in a step 130 the silicon photomultiplier 14 is interconnected to the substrate 21, in particular wire bonded on the substrate 21, creating the wire bonding 23. An alternative for the interconnection at step 130 is using a bumping technique.

Subsequently the silicon photomultiplier 14 and scintillator module 12 are encased in a step 140 in white resin to obtain the inner casing 25, by forming or dispensing over such components the white resin. Alternatively the inner casing 25 can be molded over the silicon photomultiplier 14 and scintillator module 12. The role of white resin inner casing 25 is to prevent visible and/or infrared, depending on the type of scintillator, photons PHN generated by the scintillator crystal 12 from escaping the package of the detector 20 and to reflect these photons PHN back, so as to be fully captured by the silicon photomultiplier 14.

Then, in a step 150 black resin is molded on top of the white resin casing 25 to protect the overall structure of silicon photomultiplier 14 and scintillator module 12 to form the outer casing 24.

Additionally, the process includes a final step 160 in which the package comprising by the outer casing 24, inner casing 25 and the corresponding portion of substrate 21 is singulated and, possibly, tested.

The scintillator detector 20 therefore can be miniaturized, i.e., made with size compatible with standard packaging and standard PCB sizes, so that it can be included in portable electronic devices such as mobile phones or smartphones or tablets. This allows developing software applications for mobile phones, the so called apps, which use the values supplied by the scintillator detector 20 in the output signal S for purposes like portable dosimetry, checking for radionuclide food contaminant, and also, for instance exploiting networking application, performing radioactivity mapping.

The scintillator detector here described has been tested with sources like $^{137}$Cs and $^{22}$Na and it can be reliably operated at a voltage as low as 30V, which is significantly lower than the voltage used by the known scintillator probes on PCB.

Therefore the solution here disclosed allows to obtain scintillator detector with a compact package, which is compatible with standard packaging technology, in particular LGA, for integrated circuits. This obtained by allowing for example package sizes of 5×5×5 mm$^3$, while previous scintillator detector were fairly bigger (e.g., Hamamatsu C12137 is 13×13×20 mm$^3$). Scintillator probes in a single packaging with the crystal and the photomultiplier in a same casing are obtained. A low power consumption is obtained by using a silicon photomultiplier, instead of other photon detectors, like photomultiplier tubes.

Of course, without prejudice to the principle of the disclosure, the details of construction and the embodiments may vary widely with respect to what has been described and illustrated herein purely by way of example, without thereby departing from the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A device, comprising:
a radiation scintillator detector that includes:
a substrate;
a scintillator module;

a silicon photomultiplier on the substrate and optically coupled to the scintillator module, the silicon photomultiplier is between the substrate and the scintillator module;

an outer casing extending from the substrate and enclosing the scintillator module and the photomultiplier, the scintillator module and the silicon photomultiplier are between the substrate and a portion of the outer casing; and an inner casing between the outer casing and the scintillator module, the inner casing between the outer casing and the photomultiplier, the inner casing including a resin that reflects photons emitted by the scintillator.

2. The device of claim 1 wherein said inner casing fills a space between said outer casing and said scintillator module and said silicon photomultiplier.

3. The device of claim 1 wherein the inner casing is a white pigmented resin.

4. The device of claim 3 wherein the white pigmented resin includes titanium dioxide.

5. The device of claim 1 wherein said outer casing includes a black pigmented resin.

6. The device of claim 5 wherein the black resin is an epoxy resin including carbon black.

7. The device of claim 1 wherein the outer casing is supported by said substrate.

8. The device of claim 1 wherein said silicon photomultiplier is arranged on a surface of the substrate and the scintillator module is arranged on the silicon photomultiplier.

9. A process, comprising:
forming a scintillator detector package by:
attaching a silicon photomultiplier to a surface of a substrate;
attaching a scintillator module to a surface of the silicon photomultiplier, the scintillator module being separated from the substrate by the silicon photomultiplier;
encasing the scintillator module and the silicon photomultiplier in an inner casing, a portion of the inner casing being on the substrate; and
encasing the inner casing in an outer protective resin casing.

10. The process of claim 9 wherein the forming including singulating the detector package after said encasing in the outer protective resin casing.

11. The process of claim 9 wherein said encasing the scintillator module and the silicon photomultiplier in the inner casing includes one from among dispensing a resin and molding a resin.

12. The process of claim 9 wherein encasing the inner casing in the outer protective resin casing, includes molding said outer protective resin casing.

13. The process of claim 9 wherein the forming including coupling an interconnection between the silicon photomultiplier to the substrate after attaching the scintillator module to the surface of the silicon photomultiplier.

14. The process of claim 13 wherein the coupling the interconnection including wire bonding of the silicon photomultiplier to the substrate.

15. A system, comprising:
a package that includes:
a substrate having a first surface and a second surface;
a photomultiplier chip on the first surface of the substrate;
a scintillator crystal on the photomultiplier chip;
an outer casing around the scintillator crystal and the photomultiplier chip; and
an inner casing positioned between the outer casing and the scintillator crystal and between the outer casing and the photomultiplier chip.

16. The system of claim 15 wherein the photomultiplier chip includes an array of single photon avalanche diodes aligned with the scintillator crystal.

17. The system of claim 15 wherein the outer casing has sidewalls that extend from the first surface of the substrate to an exterior surface of the outer case that is spaced from the first surface of the substrate.

18. The system of claim 15 wherein a gap between the crystal and the first surface of the substrate includes a portion of the inner casing.

19. The system of claim 15, further comprising a portable electronic device, the package being positioned within the portable electronic device.

* * * * *